United States Patent [19]

Bukhman

[11] Patent Number: 5,195,655
[45] Date of Patent: Mar. 23, 1993

[54] INTEGRATED FLUID DISPENSE APPARATUS TO REDUCE CONTAMINATION

[75] Inventor: Yefim Bukhman, Scottsdale, Ariz.

[73] Assignee: Motorola, Inc., Schaumburg, Ill.

[21] Appl. No.: 705,197

[22] Filed: May 24, 1991

[51] Int. Cl.$^5$ .............................................. B65D 35/28
[52] U.S. Cl. .......................................... 222/1; 222/95; 222/571; 239/589
[58] Field of Search ............... 222/4, 64, 95, 105, 222/107, 131, 145, 146.5, 146.2, 148, 187, 403, 423, 541, 571, 575, 568; 239/128, 135, 589, 601, 44

[56] References Cited

U.S. PATENT DOCUMENTS

| | | | |
|---|---|---|---|
| 391,336 | 10/1888 | Potter | 222/187 X |
| 3,134,518 | 5/1964 | Sagarin et al. | 222/187 X |
| 4,396,824 | 8/1983 | Fiegl et al. | 222/146.5 X |
| 4,455,470 | 6/1984 | Klein et al. | 239/128 X |
| 4,551,139 | 11/1985 | Plaas et al. | 222/105 X |
| 4,597,719 | 7/1986 | Tano | 222/571 X |
| 4,700,892 | 10/1987 | Cunning | 222/192 X |
| 4,993,593 | 2/1991 | Fabiano et al. | 222/64 X |
| 5,000,348 | 3/1991 | Emody | 222/66 |

Primary Examiner—Andres Kashnikow
Assistant Examiner—Kenneth DeRosa
Attorney, Agent, or Firm—Joe E. Barbee

[57] ABSTRACT

An integrated fluid dispense apparatus (10) suitable for delivering ultrapure fluids. The fluid is confined to a nonrigid hermetic fluid delivery apparatus (10). A pumping mechanism (11) pumps fluids in precise volumes and flow rates. A moisturizing dispense nozzle (12) provides a saturated vapor atmosphere at the nozzle tip to prevent the fluid from drying during non-dispense periods.

16 Claims, 2 Drawing Sheets

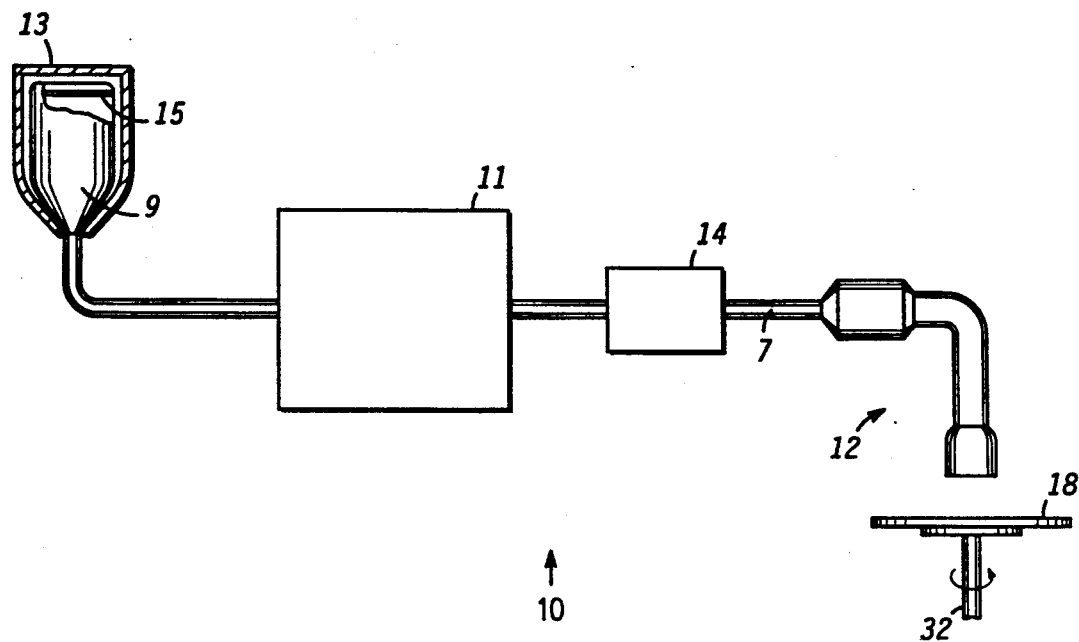
*FIG. 1*
*FIG. 2*
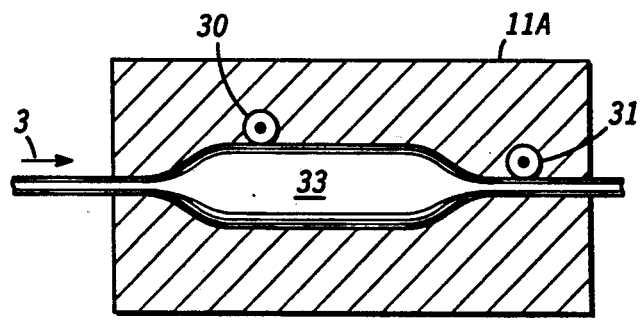

INTEGRATED FLUID DISPENSE APPARATUS TO REDUCE CONTAMINATION

BACKGROUND OF THE INVENTION

This invention relates, in general to fluid delivery systems, and more particularly to an ultrapure fluid delivery system.

Fluid delivery systems are found in a variety of industries including electronics, medical, food, and beverage. Generally, these systems have employed replaceable glass bottle fluid reservoirs and pumping mechanisms to deliver the fluid from the reservoir to a nozzle. Inherent in these fluid transport regimes is the introduction of contaminants during fluid reservoir replacement. As an example, reservoir replacement entails disconnecting the fluid delivery lines, thereby opening the fluid delivery system to contamination by particulates and air bubbles. Further, the pumping mechanism and fluids themselves are sources of particulates, hence filters may be included in the system. Changing the filters, pumps or any component in the system serves as a means for contaminant entry into the system. In addition, the construction of the nozzles through which the fluid is dispensed promotes the drying and subsequent flaking of the fluid; in a photoresist delivery system these flakes would contaminate the photoresist deposited on a wafer. Accordingly, it would be beneficial to have a fluid delivery system, such as a photoresist dispenser for use in manufacturing semiconductor products, that does not introduce contaminants into the fluid being delivered.

SUMMARY OF THE INVENTION

Briefly stated, the present invention has an integrated fluid dispense apparatus consisting of a nonrigid hermetic fluid delivery apparatus, a moisturizing dispense nozzle, and a means for pumping fluid through the hermetic fluid delivery apparatus to the moisturizing dispense nozzle. The nonrigid hermetic fluid delivery apparatus has a portion adapted to cooperate with the means for pumping and a portion that serves as a fluid reservoir.

BRIEF DESCRIPTION OF THE DRAWINGS

FIG. 1 is a cut-away side view of an embodiment in accordance with the present invention;

FIG. 2 is a cut-away side view of an embodiment of a fluid pumping mechanism;

DETAILED DESCRIPTION OF THE DRAWINGS

Figure 3:
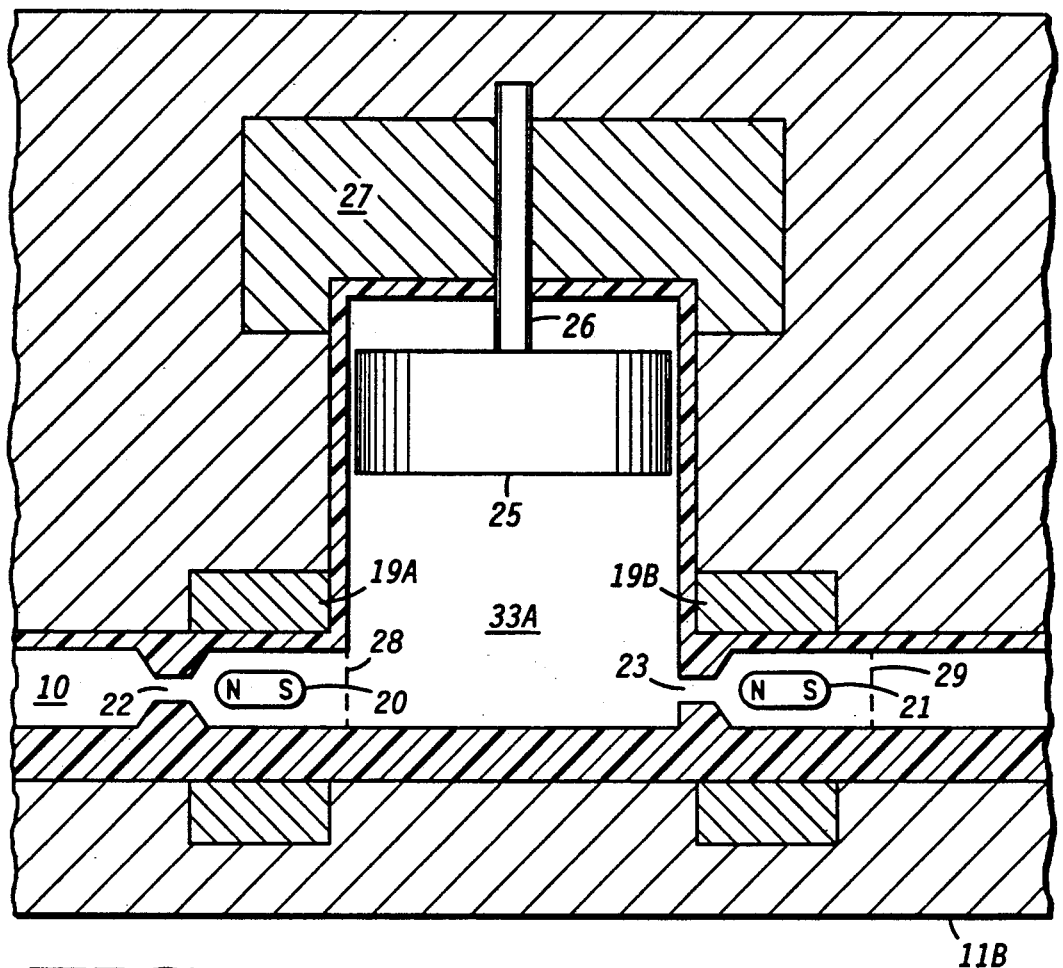
FIG. 3 is a cut-away side view of an alternate embodiment of a fluid pumping mechanism.

A cut-away side view of an integrated fluid dispense apparatus 10 is illustrated in FIG. 1. Integrated fluid dispense apparatus 10 is a nonrigid structure. Nonrigid fluid delivery apparatus 10 is a disposable hermetic unitary unit coupled to a moisturizing dispense nozzle 12. Nonrigid fluid delivery apparatus 10 has a collapsible fluid reservoir 9 supported by a housing 13. In a preferred embodiment, housing 13 also includes a level sensing means (not shown). In an alternate embodiment, housing 13 also includes a means 15 for promoting uniform collapse of collapsible fluid reservoir 9. A portion of nonrigid fluid delivery apparatus 10 is adapted to contain specified fluid volumes and to cooperate with a pumping mechanism 11 for pumping fluid towards moisturizing dispense nozzle 12. Pumping mechanism 11 pumps a predetermined fluid volume at a specified flow rate. Pumping mechanism 11 also creates a reverse pressure or suction, commonly called suckback, during nonpumping cycles to prevent fluid dispensation.

In a preferred embodiment, a portion of nonrigid fluid delivery apparatus 10 is surrounded by or in contact with a heater 14 for regulating the temperature of the fluid. Heater 14, which is thermostatically controlled, serves as a means for regulating fluid temperature. In an optional embodiment, nonrigid fluid delivery apparatus 10 includes a filter 7. Filter 7 removes any impurities not removed by the fluid manufacturer. Filter 7 is coupled to a portion of nonrigid fluid delivery apparatus 10 distal to collapsible fluid reservoir 9.

Moisturizing dispense nozzle 12 generates a saturated vapor atmosphere. Nozzle 12 is a dry-less dispense nozzle. Nozzle 12 will be discussed in greater detail in the description of FIG. 4. In a preferred embodiment, a cap (not shown) is used to seal or close the porous tip of moisturizing dispense nozzle 12 when moisturizing dispense nozzle 12 is in transit or not in use. The cap is a T-shaped element having a vertical segment or leg and a horizontal segment or head. The leg is inserted into the fluid dispensing tip of moisturizing dispense nozzle 12, and is held in position by a friction fit. The head is larger than the opening of moisturizing dispense nozzle 12 and prevents any contaminants from entering the moisturizing dispense nozzle 12.

Moisturizing dispense nozzle 12 dispenses a photoresist onto a semiconductor wafer 18 while semiconductor wafer 18 is being rotated by a shaft 32. Since a specific amount of photoresist is to be applied to wafer 18, pumping mechanism 11 forces only the specified amount of photoresist out of the moisturizing dispense nozzle 12. To prevent any excess drops from falling onto wafer 18, pump 11 has the capability of creating a reverse pressure or suckback to draw any photoresist at the tip of nozzle 12 back up into nozzle 12.

FIG. 2 is a cut-away side view of pumping mechanism 11A; including a portion of nonrigid fluid delivery apparatus 10 (shown in FIG. 1) adapted to cooperate with pumping mechanism 11A called a pumping pouch 33. Pumping mechanism 11A has a pumping roller 30 and a suckback roller 31. Pumping roller 30 and suckback roller 31 move up, down, and to the right and left. Pumping roller 30 has a home position which is above, but not in contact with pumping pouch 33, and proximal to the pump inlet. Suckback roller 31 has a home position which is above, but not in contact with pumping pouch 33, and distal to the pump inlet. Suckback roller 31 functions as a valve; the valve is defined as open when suckback roller 31 is in the home position.

To pump fluid, pumping roller 30 moves down from its home position and seals a portion of pumping pouch 33 proximal to pump inlet. After pumping roller 30 seals pumping pouch 33, suckback roller 31 moves to the suckback roller 31 home position and pumping roller 30 moves to the right. The rate at which pumping roller 30 moves to the right modulates the fluid dispense rate. After pumping the specified fluid volume, suckback roller 31 terminates active fluid flow by moving down from the suckback roller 31 home position and sealing a portion of pumping pouch 33 distal to the pump inlet. Suckback roller 31 creates reverse pressure or suckback by moving to the left. Pumping roller 30 moves to pumping roller 30 home position to be in position for the start of the next pumping cycle. In a preferred embodiment, positioning of pumping roller 30 and suckback roller 31 is computer controlled; where pumping roller positioning serves as a means for controlling fluid volume and suckback roller positioning serves as a means for controlling the reverse pressure or suckback. The arrow 3 indicates direction of fluid flow.

FIG. 3 is a cut-away side view of an alternate embodiment of a portion of nonrigid fluid delivery apparatus 10 which cooperates with a pumping mechanism IIB to pump fluid. Pumping mechanism IIB comprises a plunger 25, a pushrod 26, and an actuator 27. The portion of nonrigid fluid delivery apparatus 10 adapted to cooperate with pumping mechanism IIB is a pumping pouch 33A also referred to as a pumping container. Pumping pouch 33A has an inlet port which comprises an inlet port channel 22, an inlet port magnetic valve 20, and an inlet port perforated stop 28. Pumping pouch 33A has an outlet port which comprises an outlet port channel 23, an outlet port magnetic valve 21, and an outlet port perforated stop 29. In a preferred embodiment, the nonrigid fluid delivery apparatus 10 is a unitary unit; however, in an alternate embodiment, the pumping pouch 33A is a disposable detachable unit which may be mated with hoses at the inlet and outlet ports. Inlet magnetic valve 20 and outlet magnetic valve 21 are controlled by electromagnets 19A and 19B, respectively.

To pump fluid, electromagnet 19A closes inlet magnetic valve 20. After inlet magnetic valve 20 seals inlet port 22, electromagnet 19B opens outlet magnetic valve 21. Actuator 27 actuates pushrod 26 to distend plunger 25, forcing fluid to flow toward moisturizing dispense nozzle 12. After pumping the specified fluid volume, actuator 27 actuates pushrod 26 to contract plunger 25, creating reverse pressure or suckback. Electromagnet 19B closes outlet magnetic valve 21. After outlet magnetic valve 21 seals outlet port 23, electromagnet 19A opens inlet magnetic valve 20 to begin the next pumping cycle. In a preferred embodiment, electromagnets 19A, 19B, and actuator 27 are computer controlled.

Figure 4:
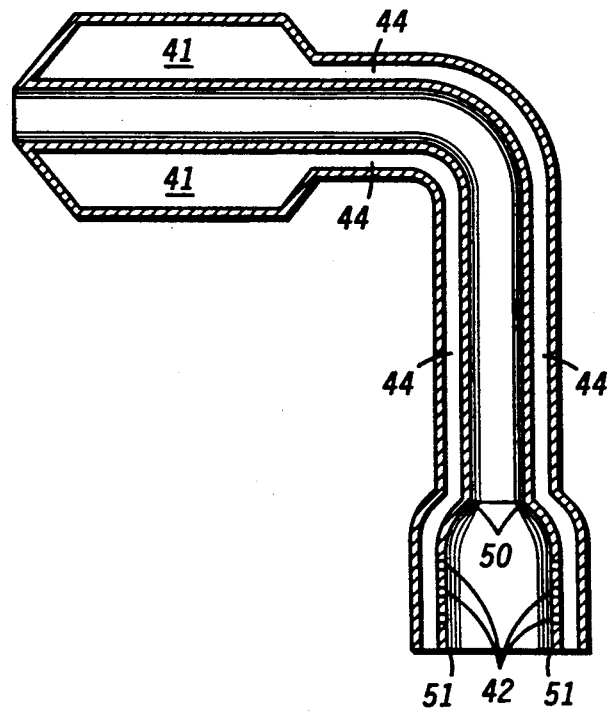
FIG. 4 is a cut-away side view of an embodiment of the solvent delivering moisturizing nozzle.

FIG. 4 is a cut-away side view of moisturizing dispense nozzle 12. A portion 41 of moisturizing dispense nozzle 12 is a solvent filled reservoir which is packed with a wicking material. A channel 44 extends from solvent reservoir 41 to a plurality of porous openings 42 at the tip of moisturizing dispense nozzle 12. Porous openings 42 deliver solvent as a saturated vapor atmosphere to the tip of moisturizing dispense nozzle 12 to keep the fluid or photoresist at the tip from drying out and forming a "skin"; resulting in flakes. The flakes would contaminate the photoresist deposited on wafer 18 (FIG. 1). The channel is filled with wicking material to facilitate movement of solvent by capillary action. Small quantities of solvent in saturated vapor form may mix with the fluid being dispensed; however, the volumes would be so minute as to have no affect on the volume, purity or dispense rate of the fluid being dispensed.

In a preferred embodiment, nonrigid fluid delivery apparatus 10 is a unitary unit; however, in an alternate embodiment the nozzle 12 can be separate from nonrigid fluid delivery apparatus 10, but adapted to fit over the tip of nonrigid fluid delivery apparatus 10. Tip of nonrigid fluid delivery apparatus 10 protrudes past the inner lip 50 of moisturizing dispense nozzle 12 but not past the outer lip 51 of moisturizing dispense nozzle 12.

By now it should be appreciated that there has been provided an improved fluid dispense apparatus suitable for delivering precise fluid volumes at precise dispense rates without the level of contaminants inherent in present fluid delivery systems. This apparatus is suitable for dispensing predetermined volumes of photoresist on a semiconductor wafer.

I claim:

1. A method for reducing fluid contamination comprising:
   providing a reservoir for containing fluid;
   providing means for cooperating with a pumping mechanism to pump the fluid; and
   generating a saturated vapor atmosphere at a nozzle from which the fluid is dispensed to prevent the fluid from drying on the nozzle.

2. The method for reducing fluid contamination of claim 1 using a solvent as the saturated vapor atmosphere.

3. The method for reducing fluid contamination of claim 1 generating a slight back pressure at completion of a dispense operation to prevent dripping fluid from the nozzle.

4. The method for reducing fluid contamination of claim 1 wherein providing the reservoir includes providing a disposable reservoir.

5. An integrated fluid dispense apparatus comprising a fluid delivering dispense nozzle having means for moisturizing a tip of said nozzle to prevent the fluid from drying in the dispense nozzle; and a fluid delivery apparatus coupled to the dispense nozzle.

6. The integrated fluid dispense apparatus of claim 5 wherein the moisturizing means includes means for delivering a solvent to said tip of the dispense nozzle.

7. The integrated fluid dispense apparatus of claim 6 wherein the means for delivering the solvent includes a reservoir packed with wicking material.

8. The integrated fluid dispense apparatus of claim 6 wherein the means for delivering the solvent creates a saturated vapor atmosphere at the dispense nozzle tip, and wherein the fluid delivery apparatus ia nonrigid hermetic unitary unit.

9. An integrated fluid dispense apparatus to reduce contamination of the fluid by particles which comprises:
   a nonrigid hermetic fluid delivery apparatus;
   a housing to support a portion of the nonrigid hermetic fluid delivery apparatus that serves as a fluid reservoir;
   a nozzle for dispensing the fluid and having means for moisturizing a tip of said nozzle to prevent the fluid from drying in the nozzle, wherein the nozzle is connected to the portion of the nonrigid hermetic fluid delivery apparatus distal to the fluid reservoir;
   means for pumping the fluid through the nonrigid hermetic fluid delivery apparatus toward the nozzle, wherein the nonrigid hermetic fluid delivery apparatus has a portion adapted to cooperate with the means for pumping; and
   means to regulate the temperature of the fluid prior to fluid dispensation.

10. The integrated fluid dispense apparatus of claim 9 wherein the nonrigid hermetic fluid delivery apparatus is a unitary unit.

11. The integrated fluid dispense apparatus of claim 9 wherein the nozzle and the nonrigid hermetic fluid delivery apparatus are a unitary assembly.

12. The integrated fluid dispense apparatus of claim 9 wherein the means for pumping includes means to prevent fluid dispensation during nonpumping cycles.

13. A photoresist delivery system to reduce contamination of the photoresist by particles which comprises:
   a photoresist reservoir;
   a pumping means wherein the pumping means is coupled to the photoresist reservoir; and
   a dispense nozzle having means for moisturizing a tip of said nozzle to prevent the fluid from drying in the dispense nozzle wherein the dispense nozzle is coupled to the pumping means.

14. The photoresist delivery system of claim 13 wherein the photoresist reservoir is hermetically coupled to the dispense nozzle.

15. The photoresist delivery system of claim 13 wherein the pumping means includes means to prevent photoresist dispensation during nonpumping cycles.

16. The photoresist delivery system of claim 13 further including a housing to support the photoresist reservoir.

* * * * *